United States Patent [19]
Murphy

[11] Patent Number: 5,463,317
[45] Date of Patent: Oct. 31, 1995

[54] SHIELD INTEGRITY MONITOR

[75] Inventor: Timothy A. Murphy, Lynnwood, Wash.

[73] Assignee: The Boeing Company, Seattle, Wash.

[21] Appl. No.: 268,053

[22] Filed: Jun. 29, 1994

[51] Int. Cl.[6] .................................................. G01R 31/02
[52] U.S. Cl. ........................ 324/520; 324/652; 324/619;
324/520; 370/13
[58] Field of Search ................................. 324/520, 539,
324/541, 543, 641, 645, 534, 535, 627

[56] References Cited

U.S. PATENT DOCUMENTS

| 1,462,053 | 7/1923 | Stoller . | |
|---|---|---|---|
| 2,499,001 | 2/1950 | Green | 324/520 |
| 2,741,740 | 4/1956 | Beck | 324/532 |
| 3,299,351 | 1/1967 | Williams . | |
| 3,667,034 | 5/1972 | Freeze . | |
| 3,728,620 | 4/1973 | Heins . | |
| 3,781,665 | 12/1973 | Gale . | |
| 3,803,484 | 4/1974 | Gray | 324/520 |
| 4,851,782 | 7/1989 | Jeerings et al. . | |

FOREIGN PATENT DOCUMENTS

| 52-45034 | 4/1977 | Japan . |
|---|---|---|
| 2128173 | 7/1988 | Japan . |
| 746343 | 7/1980 | U.S.S.R. . |

Primary Examiner—Kenneth A. Wieder
Assistant Examiner—Jose M. Solis
Attorney, Agent, or Firm—Conrad O. Gardner; B. A. Donahue

[57] ABSTRACT

An apparatus which can non-intrusively verify the integrity of shielding on electrical wiring. The method utilizes the natural resonance of the voltage transfer function of the shielded wire. The frequency of this resonance is an indication of the self inductance of the cable. A change in the resonant frequency indicates a change in the self inductance caused by a failure in the shield circuit.

4 Claims, 7 Drawing Sheets $$\frac{V_{OUT}}{V_{IN}} = \frac{1}{1-\omega^2 L C + j\omega RC}$$

$$\left|\frac{V_{OUT}}{V_{IN}}\right| = \frac{1}{\sqrt{(1-\omega^2 L C)^2 + (\omega RC)^2}} = \frac{1}{\sqrt{(1-(2\pi f)^2 L C)^2 + (2\pi f RC)^2}}$$

SHIELD INTEGRITY MONITOR

BACKGROUND OF THE INVENTION

The potential for upset or failure of a Fly By Wire (FBW) aircraft control system due to electromagnetic interference is a source of serious concern. The probability that critical avionics circuitry may be exposed to harmful levels of electromagnetic interference is increased when the shielding effectiveness is degraded. Problems such as intermittent data transmission errors are a common result, but complete system failure(s) may occur. In many applications shielded wires are used to route aircraft control signals from control circuitry in part of the aircraft to another. The integrity of the wire shielding may be critical when the wires may be exposed to hazardous environmental electromagnetic effects such as lightning and High Intensity Radiated Fields (HIRF) Signals. It is therefore desirable that the integrity of shielding on certain wires be non-intrusively tested.

BACKGROUND ART

In the past, the verification of the integrity of electromagnetic shielding on wires has been accomplished by periodic visual inspection. Some standard electrical tests are also available for verifying the integrity of wire shields. However, these tests have typically required that the circuits be externally probed or disconnected and examined with specialized equipment. These methods tend to be inconvenient as they require skilled personnel and can only identify problems during normal maintenance cycles.

Several patents relate to prior art concerned with resonant frequency, e.g. U.S. Pat. No. 3,667,034 to freeze which tests electrical windings (not cables). Also, Japanese Patent No. 52-45034 which relates to detecting a disconnection on a power line by noting the change in resonance current partly produced by a transformer. U.S. Pat. No. 3,781,665 to Gale, U.S. Pat. No. 3,728,610 to Heins and U.S.S.R. No. 746,343 utilize resonant oscillation to determine distance to a major fault in a line. A further U.S. Pat. No. 4,851,782 to Jeerings et al. utilizes current voltage phase change to detect faults.

SUMMARY OF THE INVENTION

An apparatus and method for automatically and non-intrusively verifying the integrity of shielding on wires utilizing the natural resonance of the voltage transfer function.

BRIEF DESCRIPTION OF THE DRAWINGS

Further advantages and uses of the invention will become more apparent when considered in view of the following detailed description of a preferred embodiment of the invention taken in conjunction with the accompanying drawings in which.

DESCRIPTION OF THE PREFERRED EMBODIMENT

Figure 1:
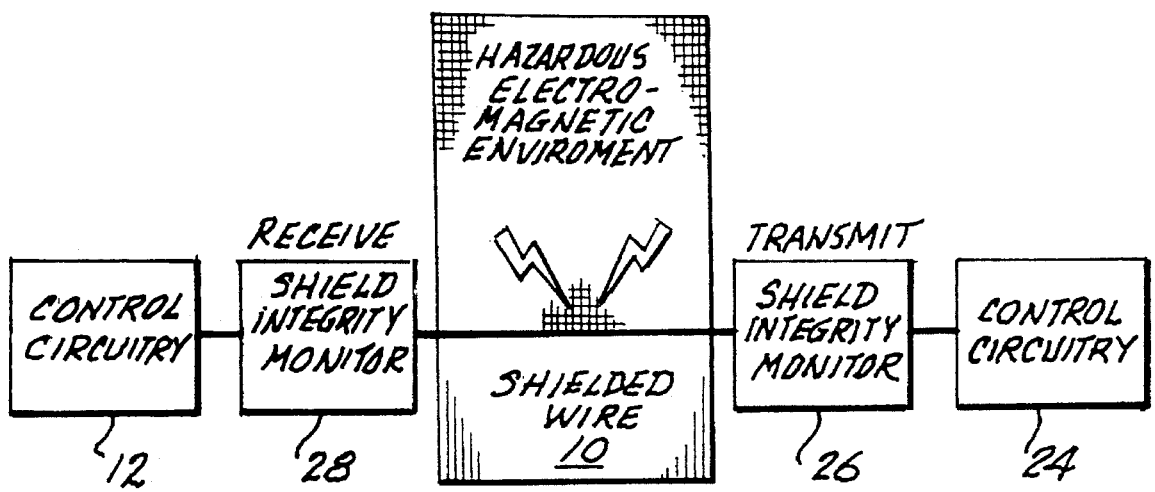
FIG. 1 is a block diagram illustrative of the system concept of the present shield integrity monitor (S/M)

FIG. 1 illustrates the basic concept of the present shield integrity monitor (SIM). Monitor circuitry is placed at either end of a run of shielded wire 10 too be monitored. When not operating, the SIM will simply pass the signals between the two control devices 12 and 24. The SIM will be transparent to the control circuitry. When operations, one of the SIM modules (transmit module 26) will transmit a test signal which is passed through shielded cable 10 and then analyzed by the other (receive 28) SIM module. Specific characteristics of the test signal will indicate whether or not the shield circuitry 10 is intact. The SIM functions may be integrated right into the control circuitry and designed to operate between normal control circuitry operations. With filtering, a further option may be to operate the shielding monitor circuitry during the normal operation of the control circuitry.

THEORY OF THE OPERATION OF SIM

Figure 2:
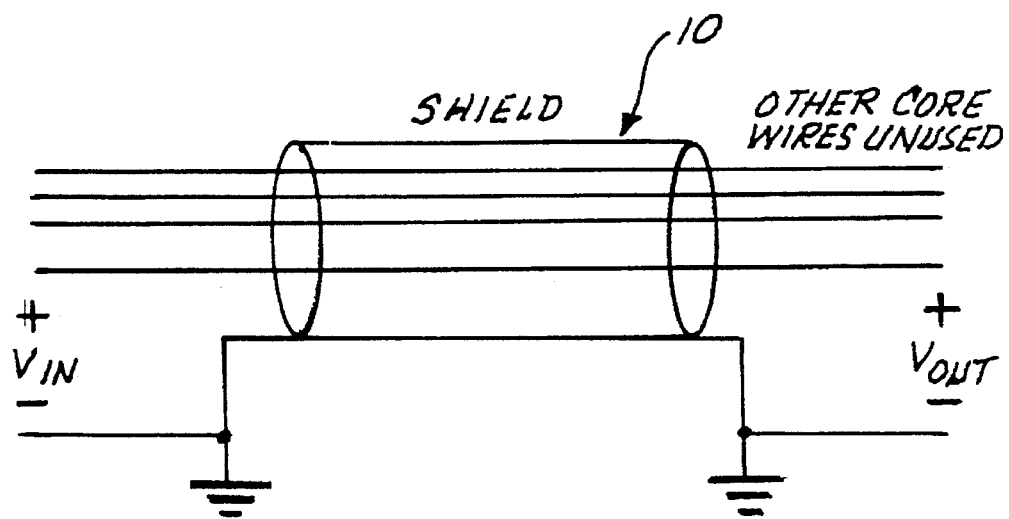
FIG. 2 is a diagram of a shielded cable having a plurality of inner core wire conductors.

The SIM determines if the shield circuit is intact by measuring a very specific feature of the voltage transfer function of the shielded wire. FIG. 2 illustrates a typical shielded wire system and defines an input and output voltage.

When the frequency of the signal carried by shielded wire 10 is low enough that the length of the wire is short compared to a wavelength, cable 10 illustrated in FIG. 2 may be reasonably modeled by the equivalent circuit corresponds to the self inductance of the shielded wire. The capacitance corresponds to the capacitance between core wire and the shield. The resistance corresponds to the resistance of the core wire. Both the inductance and the capacitance will be a function of the length of the cable. Furthermore, importantly, the inductance value will change as a function of the integrity of the shield around the wire. If the shield circuit is broken, no current will flow in the shield and the shield will no longer define the loop enclosing the flux for the self inductance. The self inductance will then be made from a larger loop: one defined by other shielded wires or the aircraft structure. This larger 'loop area' creates a larger self inductance. Hence, an increase in the self inductance of the cable indicates that the shield circuit is broken.

A simple method exists for measuring a change in the self inductance of the circuit. Consider first, the voltage transfer function for the low frequency equivalent circuit is given by the equation of FIG. 3A.

Figures 3, 3A, 3B:
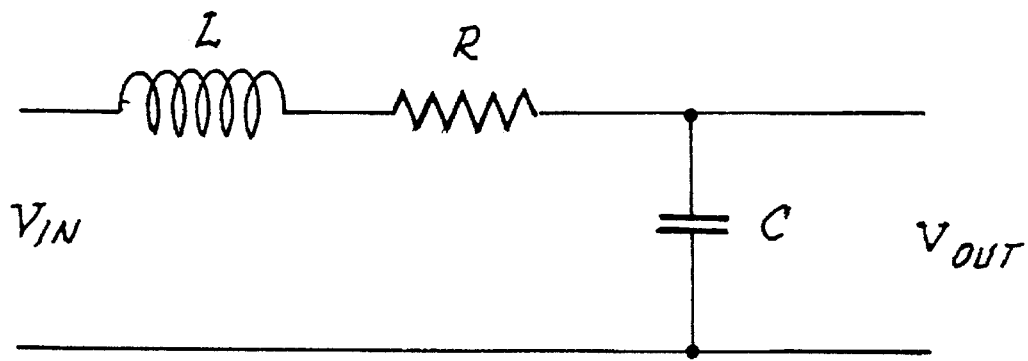
FIGS. 3, 3A and 3B pertain to a schematic of the equivalent low frequency circuit for the cable of FIG. 2.

The magnitude of the transfer function is then given by the equation of FIG. 3B.

Figure 4:
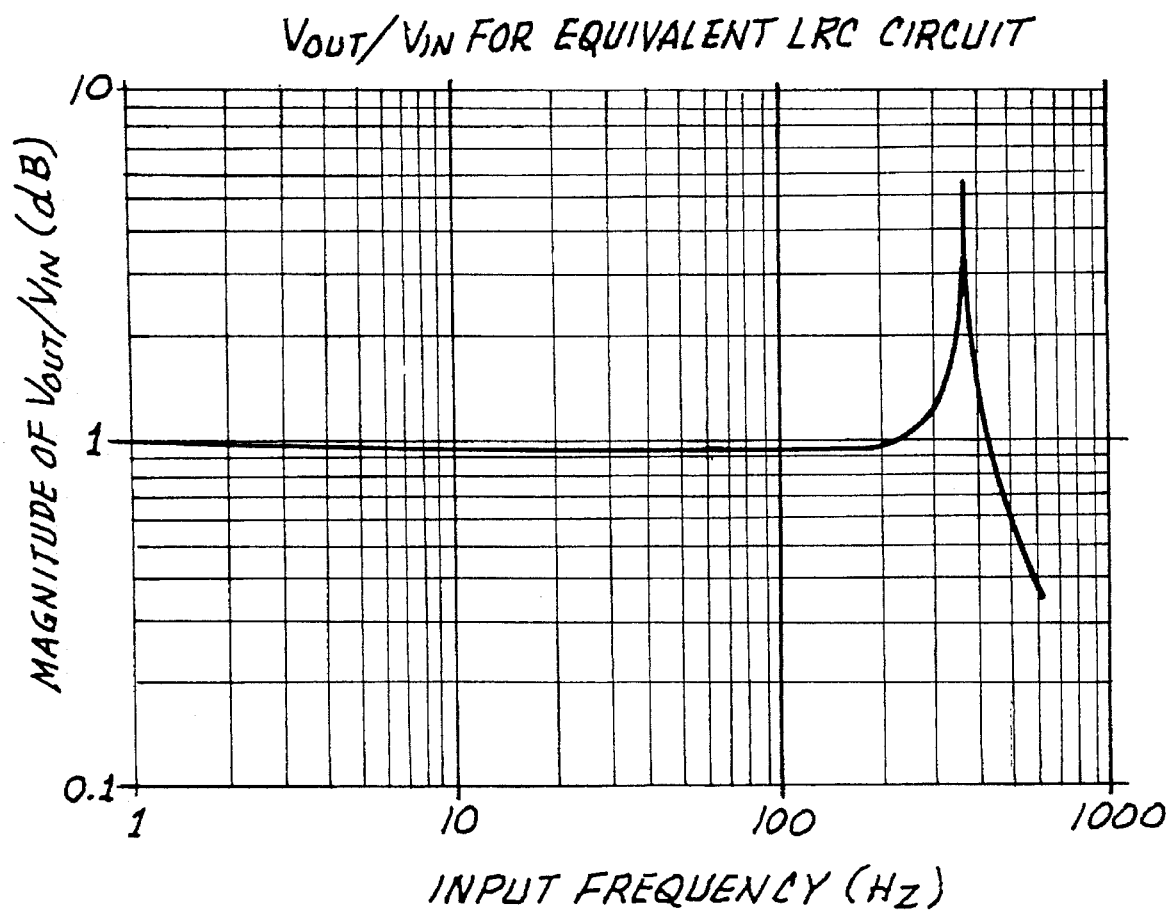
FIG. 4 is a graph illustrative of a typical plot of the magnitude of the voltage transfer function for the low frequency equivalent circuit of FIG. 3.

FIG. 4 illustrates the typical shape of the magnitude of the voltage transfer function. Note that a resonance occurs just before the voltage response of the circuit begins to fall off at higher frequencies. Examination of equation of FIG. 3B indicates that this resonance occurs at a frequency defined by the equation of FIG. 4.

The equation of FIG. 4 states that the resonant frequency of the cable is a function of the self induction of the cable. Therefore, any change in the resonant frequency of the cable would indicate a change in the self inductance of the cable and hence, indicate that the shield circuit has been broken.

Figure 5:
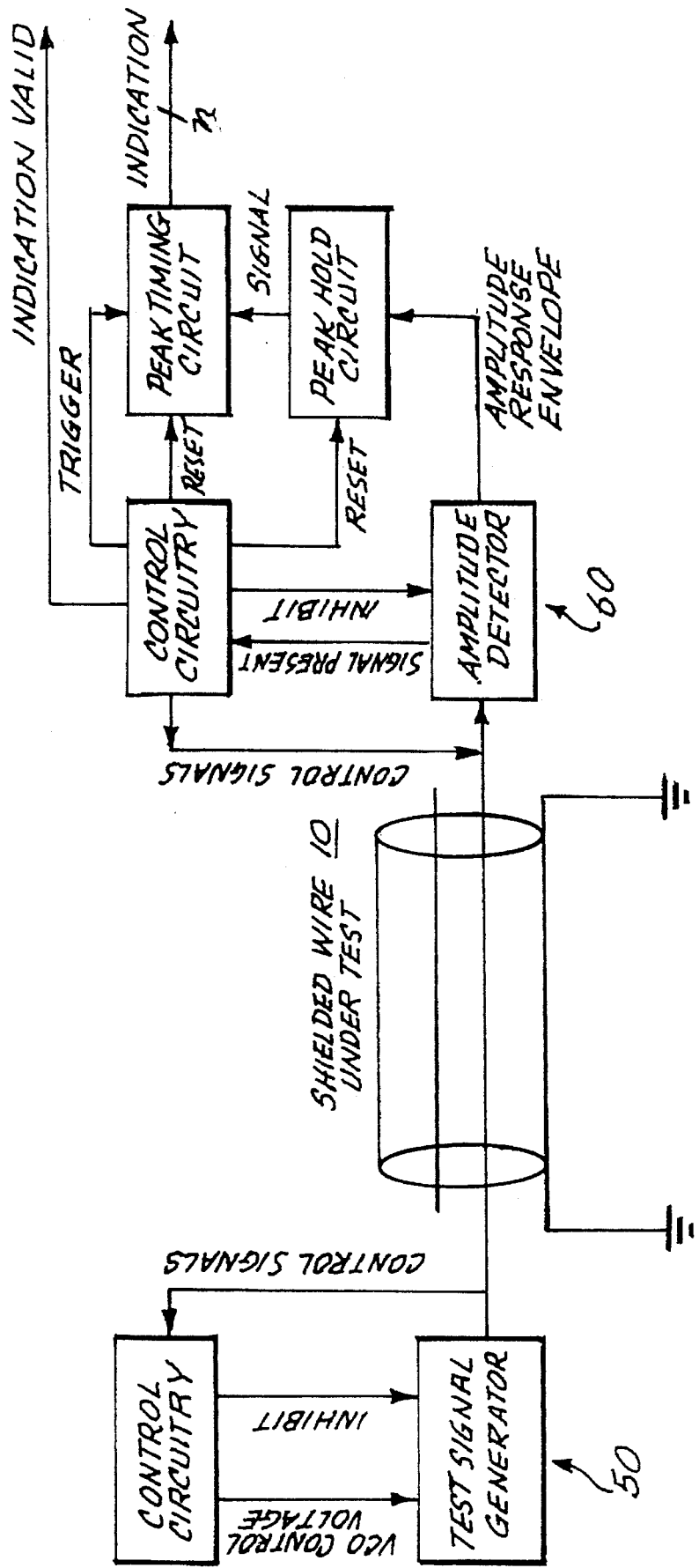
FIG. 5 is a system diagram of the present SIM transmit and receive circuits.

FIG. 5 is illustrative of a pair of circuits which will measure the resonant frequency of the cable. The basic operation is as follows: The transmit circuitry applies a frequency modulated sinusoidal signal of constant amplitude to core wire 10. The sinusoidal signal is frequency modulated such that the frequency will sweep across the resonant frequency of the cable. The voltage amplitude of the signal at the receiver 60 will be a maximum at the resonant frequency. The receiver circuitry detects the amplitude of the test signal and thereby determines the resonant frequency.

Figure 6:
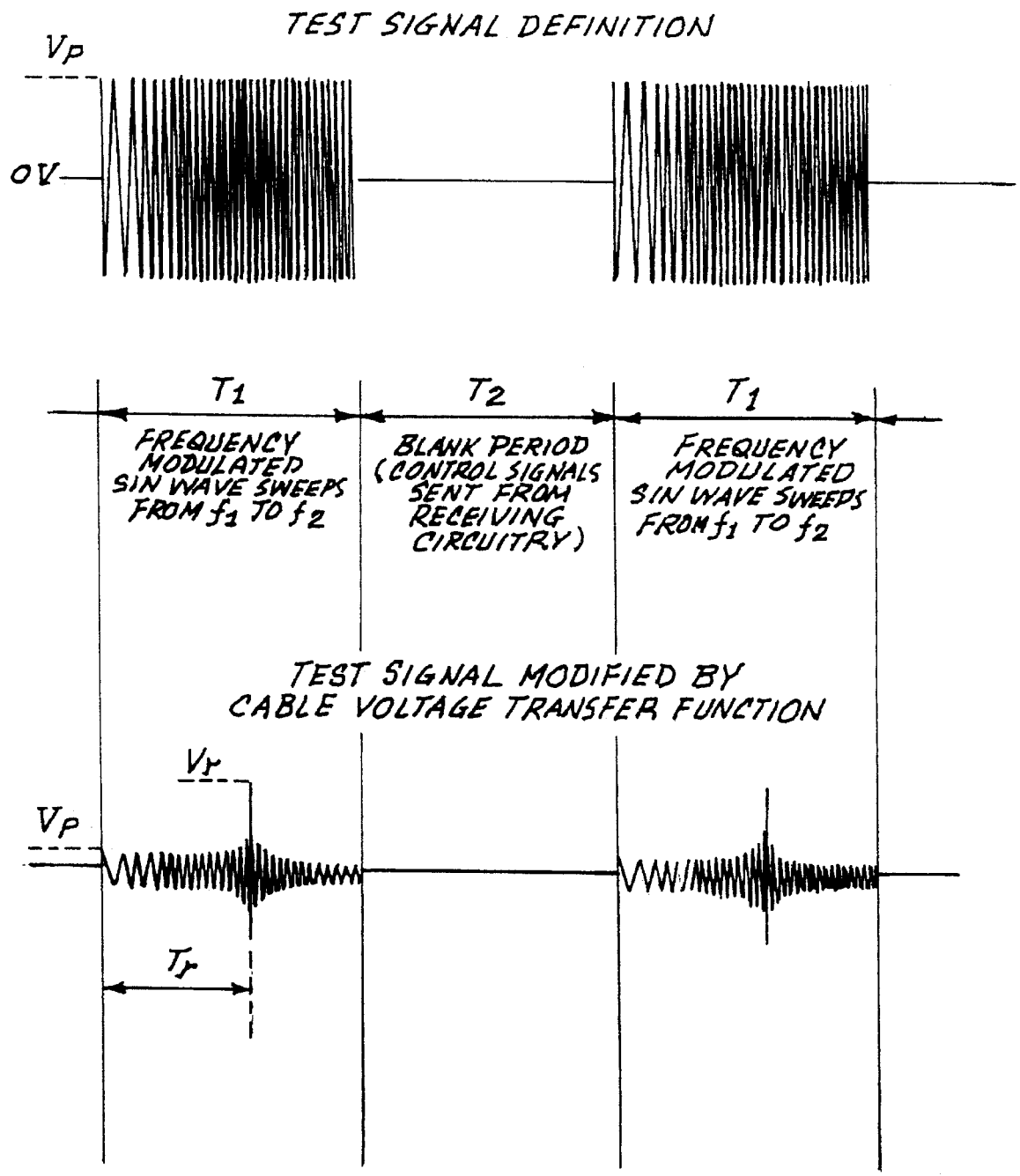
FIG. 6 is a plot illustrative of the test signal definition and also the test signal modified by the cable voltage transfer function.
Figure 7:
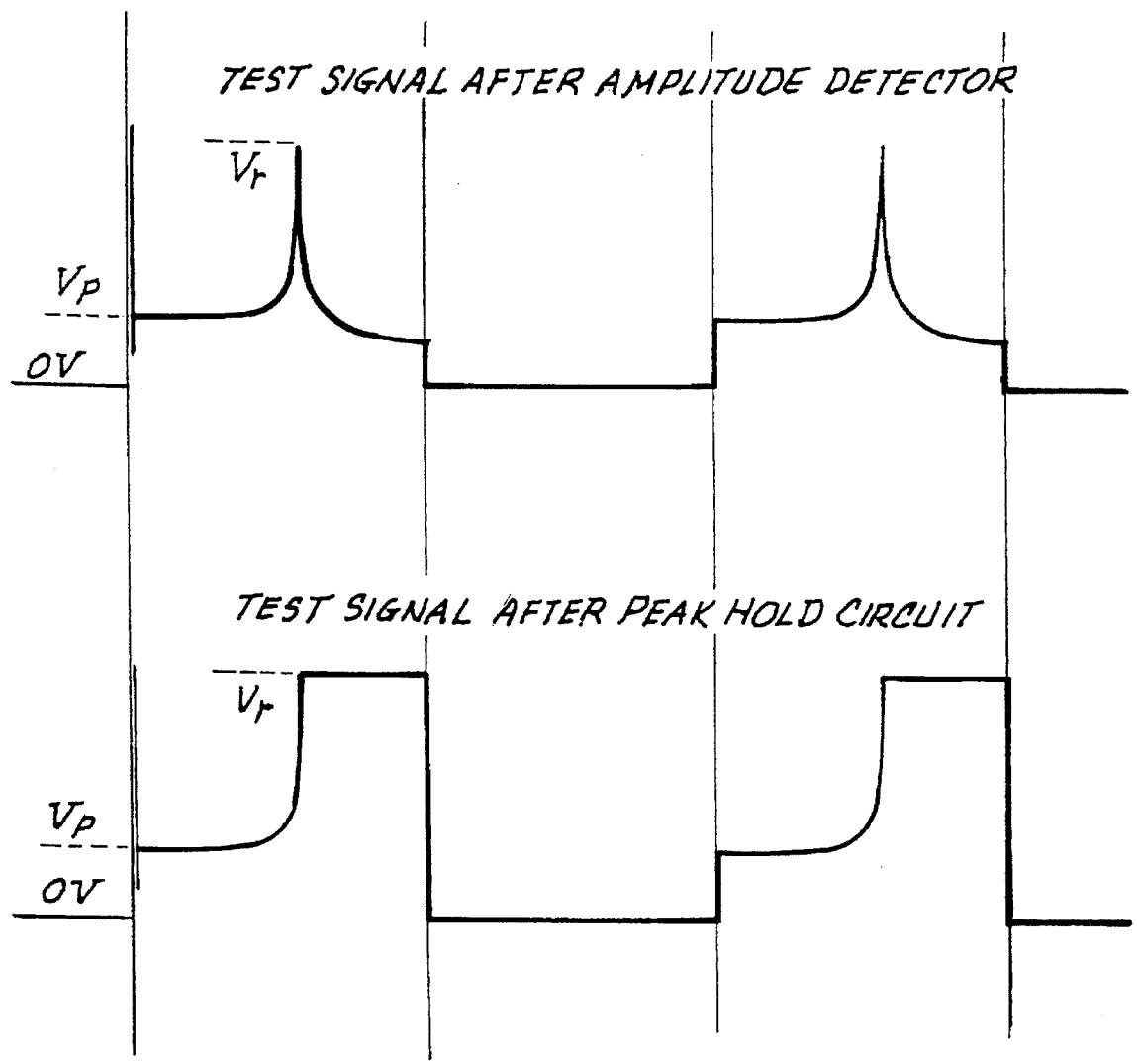
FIG. 7 shows how the test signal is demodulated by the receive circuitry, viz. shows a plot illustrative of the test signal after the amplitude detector of the system of FIG. 5; and, FIG. 8 shows the wave shapes of other control signals in the system of FIG. 5, viz. the peak timing trigger signal, an indication valid signal, reset signal, amplitude detect inhibit signal, and amplitude detector signal present.

There are may different configurations in which the test signal might be frequency modulated and demodulated such that a measurement of the resonant frequency results. One configuration, for purposes of illustration, is illustrated in FIGS. 5, 6, and 7.

The FIG. 5 operates as follows: The test signal is frequency modulated with a sawtooth wave so that the frequency varies linearly with time front $f_1$ to $f_2$. The test signal is then 100% amplitude modulated by a square wave at ½ the frequency of the sawtooth wave function. This amplitude modulation results in 'blank periods' between sweeps of the test signal. The test signal is illustrated in FIG. 6. After passing through shielded wire 10, the amplitude envelope of the test signal will acquire the shape of the magnitude of the voltage transfer function as illustrated in FIG. 4 and defined in the equation of FIG. 3. The test signal as modified by the voltage transfer function of shielded wire 10 is also shown in FIG. 6. The receiving circuitry amplitude demodulates the test signal as shown in FIG. 7. The control circuitry then measures the time between the start of the sweep and the peak signal $T_p$. Since the frequency varies linearly with time, the time interval is an indication of the (relative) frequency of the resonance.

Figure 8:
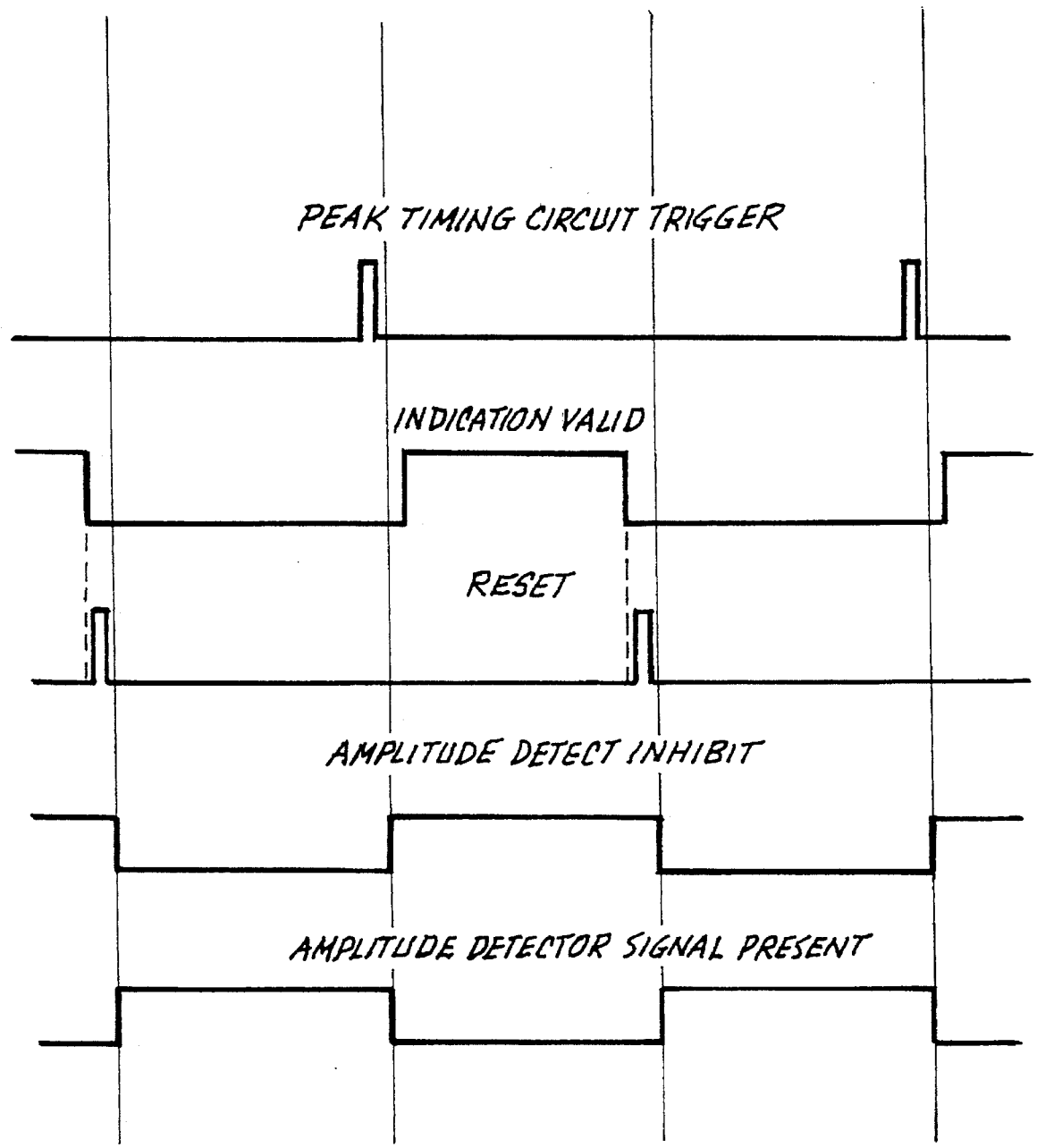

The system of FIG. 5 provides for control signals to be sent from receiving circuit 60 to transmitting circuit 50 between frequency swept pulses. These signals may be used to control the test signal generator amplitude and to activate and deactivate the test signal generator. FIG. 8 is a timing diagram which is helpful in illustrating the relationship between various control signals of the system of FIG. 5.

The resonant frequency of shielded wire 10 is typically well above any frequency which may be normally be used by control systems which may use the wire. Therefore, with filtering, the shield monitor could be operated at the same time that the wire is being used for its intended purpose.

As herein above described a system is shown which will detect the integrity of shielding on a wire non-intrusively. The system utilizes the natural resonance of the voltage transfer function of the shielded wire. The frequency of this resonance is an indication of the self inductance of the core wire. A change in the resonant frequency indicates a change in the self inductance which would be caused by a broken shield circuit.

Different embodiments of the present invention may be developed without departing from the spirit and scope of the invention, the present preferred embodiment being merely illustrative of the present invention defined only in the appended claims.

What is claimed is:

1. A shield integrity monitor system for a shielded wire cable having first and second ends comprising in combination:

a test signal generator coupled to a first end of said shielded wire cable for sweeping across the resonant frequency of the shielded wire cable;

a receiving circuit coupled to said second end of said shielded wire cable for determining a change in the resonant frequency of said shielded wire cable indicating the presence of a broken shield circuit of said shielded wire cable.

2. The shield integrity monitor of claim 1 wherein said receiving circuit comprises:

an amplitude detector;

a peak timing circuit; and, a peak hold circuit coupled between said amplitude detector and said peak timing circuit.

3. The shield integrity monitor of claim 1, wherein said test signal generator provides a test signal frequency modulated with a sawtooth wave so that the frequency varies linearly with time from a frequency $f_1$ to a frequency $f_2$; and wherein said test signal is further 100% amplitude modulated by a square wave at ½ the frequency of the sawtooth wave function.

4. A shield integrity monitor system for a shielded wire cable having first and second ends comprising in combination:

a test signal generator coupled to a first end of said shielded wire cable for sweeping across the resonant frequency of the shielded wire cable;

a receiving circuit coupled to said second end of said shielded wire cable for determining a change in the resonant frequency of said shielded wire cable indicating the presence of a a degraded shield circuit of said shielded wire cable.

\* \* \* \* \*